United States Patent [19]

Katoh

[11] Patent Number: 5,721,700

[45] Date of Patent: Feb. 24, 1998

[54] NON-VOLATILE SEMICONDUCTOR MEMORY DEVICE IN WHICH APPLIED VOLTAGE TO FERROELECTRIC CAPACITOR IS ADJUSTED

[75] Inventor: Yuukoh Katoh, Tokyo, Japan

[73] Assignee: NEC Corporation, Tokyo, Japan

[21] Appl. No.: 754,533

[22] Filed: Nov. 21, 1996

[30] Foreign Application Priority Data

Jan. 26, 1996 [JP] Japan ................................ 8-032858

[51] Int. Cl.⁶ .................................................. G11C 11/22
[52] U.S. Cl. ........................... 365/145; 257/295; 257/296
[58] Field of Search ............................. 365/145, 149; 257/295, 296, 300, 306

[56] References Cited

U.S. PATENT DOCUMENTS

| | | | |
|---|---|---|---|
| 5,307,305 | 4/1994 | Takasu | 365/145 |
| 5,481,490 | 1/1996 | Watanabe | 365/145 |
| 5,495,117 | 2/1996 | Larson | 257/295 |
| 5,523,964 | 6/1996 | McMillan | 365/145 |

FOREIGN PATENT DOCUMENTS

| | | |
|---|---|---|
| 3-32066 | 2/1991 | Japan . |
| 4-177699 | 6/1992 | Japan . |
| 5-145077 | 6/1993 | Japan . |
| 5-304299 | 11/1993 | Japan . |

*Primary Examiner*—David C. Nelms
*Assistant Examiner*—Son Mai
*Attorney, Agent, or Firm*—Sughrue, Mion, Zinn, Macpeak & Seas, PLLC

[57] ABSTRACT

A semiconductor memory device is composed of a plurality of memory cells. Each memory cell is comprised of a field effect transistor formed on a semiconductor substrate, wherein said field effect transistor is composed of a gate electrode structure which is composed of a gate insulating film and a gate electrode provided thereon, and source and drain regions. The memory cell is further composed of a ferroelectric capacitor composed of a lower electrode connected to said gate electrode, an upper electrode, and a capacitive ferroelectric film disposed between said upper and lower electrodes. In this case, an area of said ferroelectric capacitor is smaller than an area of one of said gate electrode and an active region of said gate electrode such that an electric field applied to said ferroelectric film is larger than a coercive electric field of said ferroelectric film and an electric field applied to said gate insulating film is smaller than a breakdown electric field of said gate insulating film.

16 Claims, 11 Drawing Sheets

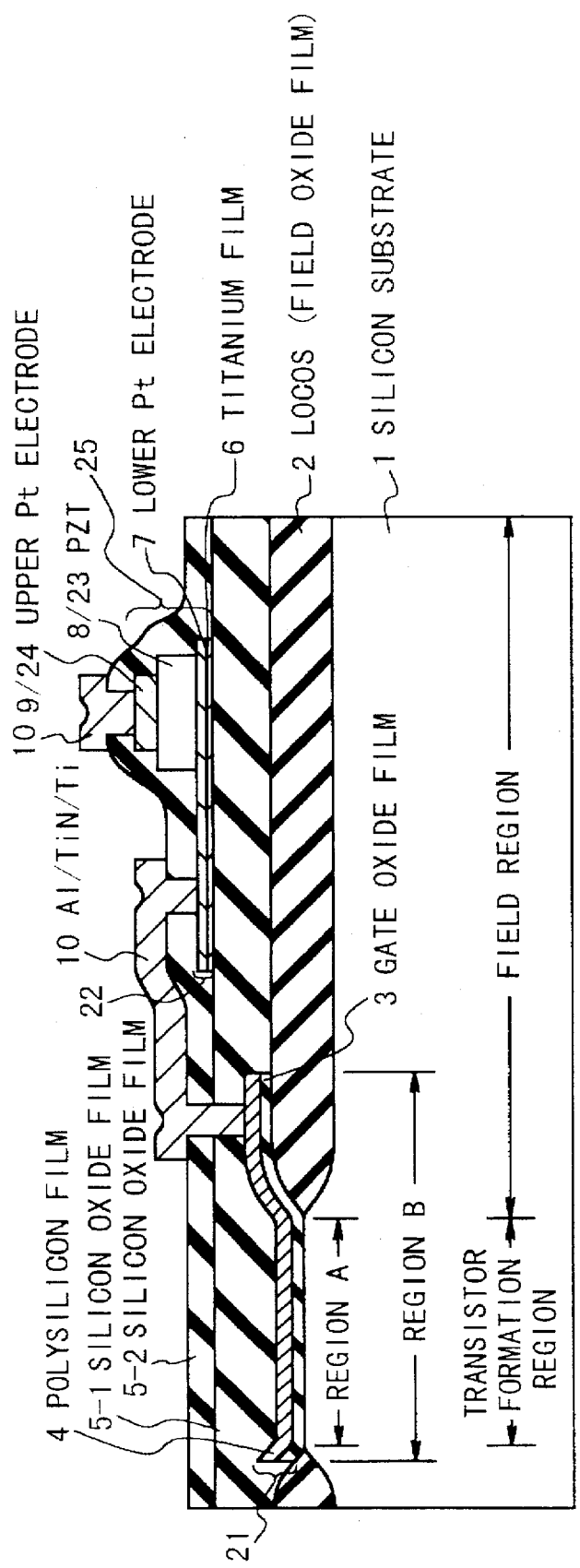

NON-VOLATILE SEMICONDUCTOR MEMORY DEVICE IN WHICH APPLIED VOLTAGE TO FERROELECTRIC CAPACITOR IS ADJUSTED

BACKGROUND OF THE INVENTION

1. Field of the Invention

The present invention relates to a semiconductor device, and more particularly to a non-volatile semiconductor memory device including a plurality of memory cells each of which is composed of a ferroelectric capacitor and a metal-insulator-semiconductor field effect transistor (MISFET) connected thereto.

2. Description of Related Art

Conventionally, a non-volatile semiconductor memory device is proposed in which the gate electrode of a MISFET and a ferroelectric capacitor are connected. FIG. 1 is a circuit diagram illustrating an example of such a nonvolatile semiconductor memory device. Referring to FIG. 1, the gate electrode of the MISFET is connected to one of the electrodes of the ferroelectric capacitor. Ferroelectric substance used for the ferroelectric capacitor polarizes when a voltage is applied. Therefore, in the semiconductor memory device, a voltage is applied between one of the electrodes of the ferroelectric capacitor which electrode is not connected to the gate of the MISFET and a silicon substrate or a source or drain region of the MISFET to polarize a ferroelectric film in the ferroelectric capacitor. At this time, because negative charges are attracted to or repulsed from the silicon substrate surface depending upon the direction of the polarization, the threshold voltage of the MISFET changes. Therefore, by examining current flowing between the source region and the drain region in the MISFET, the storage state of the non-volatile memory cell can be determined. Further, because remaining polarization is left as the nature of the ferroelectric substance even if the applied voltage is removed after the polarization is once achieved, the threshold voltage of the memory cell is held in the changed state.

A non-volatile semiconductor memory device can be fabricated using the these storage capability and non-volatileness. Taking account for noise margin in a read operation, it is preferred that charge density in the channel region of the MISFET changes greatly in the polarization direction.

In a case where wiring is connected to a connection node between one of the electrodes of the ferroelectric capacitor and the gate electrode of the MISFET as shown in FIG. 2, if the drain of another MISFET is connected to the connection node and the other MISFET is turned off so that it is set to a high impedance state, the polarization can be generated as mentioned above.

FIG. 3 illustrates the structure of the non-volatile semiconductor memory device which is proposed in Japanese Laid Open Patent Disclosure (JP-A-Heisei 4-177699). In this structure, one of the electrodes of ferroelectric capacitor 115 is connected to the gate electrode of a MISFET 116 formed on a semiconductor substrate and the other electrode of the ferroelectric capacitor 115 is connected to a non-linear conductive device (MIM) 114. A data can be written in a memory cell having the structure shown in FIG. 3 by applying between the non-linear conductive device 114 and the semiconductor substrate such that a ferroelectric film of the ferroelectric capacitor 115 is polarized. Also, the data can be read by utilizing the change of current flowing between the source region and drain region in the MISFET 116 in accordance with the intensity and direction of the polarization.

FIG. 4 illustrates a cross sectional structure of a non-volatile semiconductor memory device which is proposed in Japanese Laid Open Patent Disclosure (JP-A-Heisei 5-145077). The semiconductor memory device has the structure composed of an upper platinum electrode 118, a ferroelectric film 119, a lower platinum electrode 120, a dielectric film 21 having a high relative dielectric constant, and a semiconductor substrate 117 in this order from the top, as shown in the FIG. 4. In this case, a voltage is applied between the upper platinum electrode 118 and an $n^+$-type source region 123 or $n^+$-type drain of the semiconductor substrate 117 such that the ferroelectric film 119 is polarized. Thus, a data can be written in the memory device.

There is not limitation about the ferroelectric capacitor area and the gate area of the MISFET in the above-mentioned conventional examples shown in FIGS. 3 and 4.

Next, other two conventional non-volatile semiconductor memory devices in which a voltage is applied to a lower electrode will be described below.

FIG. 5 illustrates a cross sectional structure of a conventional non-volatile semiconductor memory device which is proposed in Japanese Laid Open Patent Disclosure (JP-A-Heisei 3-32066). In this structure, a silicon oxide film 105 as a gate insulating film is formed on a semiconductor substrate 101 and then a ferroelectric capacitor composed of a lower electrode 127, a ferroelectric film 126, and an upper electrode 125 are formed on the silicon oxide film 105. The lower electrode 127 functions as one of the electrodes of ferroelectric capacitor and at the same time as the gate electrode of a MOSFET. The ferroelectric film 126 is polarized by applying a voltage between the upper electrode 125 and the lower electrode 127.

FIG. 6 illustrates a cross sectional structure of another conventional non-volatile memory device which is proposed in Japanese Laid Open Patent Disclosure (JP-A-Heisei 5-304299). This structure is composed of an upper electrode 134, a ferroelectric film 133, a lower electrode 132, an insulating film 131, and a semiconductor substrate 101. A data can be written in a memory cell of the semiconductor memory device by applying a voltage between the lower electrode 132 and the upper electrode 134 such that the ferroelectric film 133 is polarized.

In the examples shown in FIGS. 5 and 6, there is also no limitation about the ferroelectric capacitor area and the gate area of the MISFET in the structure, like the examples is shown in FIGS. 3 and 4. Also, in the above structure, the upper electrode area is equal to the lower electrode area.

As described above, in the non-volatile semiconductor memory device using a ferroelectric film, it is important to make the ferroelectric film strongly polarize for stable read and write operation. FIG. 7 illustrates an example of dependency of retention of PZT upon applied voltage. The retention reduces depending on time is measured. When an applied electric field is small, retention is also small and polarization is relatively greatly reduced. Therefore, in a case of small polarization, noise endurance becomes wrong. For this reason, it is desirable for the electric field to be large.

In a case where a ferroelectric capacitor is connected to the gate MISFET, when a voltage is applied to the source/drain region and the ferroelectric capacitor, the applied voltage is equal to the summation of a voltage applied to the ferroelectric capacitor, a voltage applied to the gate insulating film of the MISFET and a voltage generated because of the bend of the band in the semiconductor substrate on which the MISFET is formed. Therefore, various elements are intertwined for the stable read and write operation in the ferroelectric memory device.

Now consider a case of two capacitors such as a ferroelectric capacitor and a gate capacitor connected in series. In this case, it is assumed that the area of the ferroelectric capacitor is equal to that of a gate electrode of a MISFET and the thickness of a ferroelectric film is equal to that of a gate insulating film of the MISFET. The dielectric constant of the ferroelectric film material is typically larger than that of the gate insulating film material. For example, the relative dielectric constant of the silicon oxide film which is most often used as the gate insulating film is about 3.9, whereas that of PZT which is a ferroelectric substance is about 1000.

In a case where a voltage is applied between the electrode of the ferroelectric capacitor and the drain, source or semiconductor substrate of the MISFET in the structure of FIG. 1, such that the ferroelectric film is polarized, most of the applied voltage has been applied to the gate insulating film, because the capacitance of the ferroelectric capacitor becomes larger 1000/3.9 times due to the difference of the relative dielectric constants, compared to the gate insulating film capacitor. For this reason, the ferroelectric film which voltage is not almost applied is only a little polarized. When polarization is a little, there is only a small difference between a charge amount when charges are attracted to the channel region of the transistor and a charge amount when the charges are repulsed from the channel region in the polarization. As a result, the change on the transistor characteristic depending on the polarization direction becomes small. In this manner, according to the conventional technique in which difference between the two states is determined based on current flowing between the source and drain, there is a problem in that a read error is easily generated due to noise.

In such a case, how a higher voltage is applied to the ferroelectric film is important in order to ensure the stable read and write operations. As one method, it could be considered that the applied voltage is increased. However, because most of increased voltage would be applied to the gate insulating film, the applied voltage is limited by the breakdown voltage of the gate insulating film. Therefore, a too high voltage cannot be applied.

In a case where two capacitors are connected in series, if the capacitance of one of the two capacitors is smaller than that of the other, the voltage applied to the one capacitor becomes large. One method of making a capacitance small is to make a dielectric film thicker. In the ferroelectric capacitor, if the ferroelectric film thickness is increased, higher voltage can be applied between the electrodes. However, electric field inside of the ferroelectric film becomes small so that the polarization becomes weak. If the gate insulating film is made thin such that the gate capacitance is increased, the voltage applied to the ferroelectric film can be increased. In this case, however, the breakdown voltage of the gate insulating film is downed. Therefore, the applied voltage itself must be decreased. In this manner, it is difficult to increase the polarization amount of the ferroelectric film by changing the film thickness of capacitive film.

SUMMARY OF THE INVENTION

The present invention is made in light of the above mentioned circumstances, and has, as an object, to provide a non-volatile semiconductor memory device in which the electric field applied to a ferroelectric film is made strong such that the ferroelectric film is strongly polarized, so that the difference of channel section charge density in a polarization direction is made large.

In order to achieve an aspect of the present invention, a semiconductor memory device composed of a plurality of memory cells, each of which includes a field effect transistor formed on a semiconductor substrate, wherein the field effect transistor is composed of a gate electrode structure which is composed of a gate insulating film and a gate electrode provided thereon, and source and drain regions, and a ferroelectric capacitor composed of a lower electrode connected to the gate electrode, an upper electrode, and a capacitive ferroelectric film disposed between the upper and lower electrodes, wherein an area of the ferroelectric capacitor is smaller than an area of one of the gate electrode and an active region of the gate electrode such that an electric field applied to the ferroelectric film is larger than a coercive electric field of the ferroelectric film and an electric field applied to the gate insulating film is smaller than a breakdown electric field of the gate insulating film.

In this case, each memory cell may further include a first insulating film provided on the substrate including the gate electrode structure, wherein the ferroelectric capacitor is provided on the first insulating film, the ferroelectric film is provided on a portion of the lower electrode, and the upper electrode is provided on a portion of the ferroelectric film above the lower electrode, a second insulating film provided on the first insulating film including the ferroelectric capacitor, a first wiring pattern provided on the second insulating film to connect between the gate electrode and the lower electrode, and a second wiring pattern provided on the second insulating film and connected to the upper electrode.

In another embodiment, the ferroelectric capacitor includes the lower electrode provided directly on the gate electrode with the same area as that of the gate electrode, the ferroelectric film provided directly on the lower electrode with the same area as that of the gate electrode, and the upper electrode provided directly on a portion of the ferroelectric film above the lower electrode.

In another embodiment, the ferroelectric capacitor includes the lower electrode provided directly on the gate electrode with the same area as that of the gate electrode, an insulative preventing film for preventing diffusion of a ferroelectric material, the ferroelectric film provided on the preventing film, wherein the ferroelectric film is used in common to another memory cell, and the upper electrode provided directly on a portion of the ferroelectric film above the lower electrode, and wherein the memory cell includes an insulating film provided on the ferroelectric capacitor, and a wiring pattern provided on the insulating film and connected to the upper electrode.

In another embodiment, the ferroelectric capacitor includes the lower electrode provided directly on the gate electrode with the same area as that of the gate electrode, an insulative preventing film for preventing diffusion of a ferroelectric material, and the ferroelectric film provided on the preventing film, wherein the ferroelectric film is used in common to another memory cell, and wherein the memory cell includes an insulating film provided on the ferroelectric capacitor, and a wiring pattern provided on the insulating film and connected to the ferroelectric film above the lower electrode such that the wiring pattern is used as the upper electrode.

In another embodiment, each memory cell further includes a first insulating film provided on the substrate including the gate electrode structure, the lower electrode provided on a portion of the first insulating film, the ferroelectric film provided on the first insulating film including the lower electrode such that the ferroelectric film is used in common by another memory cell, the upper electrode provided on a portion of the ferroelectric film above the lower electrode, a second insulating film provided on the ferroelectric film including the upper electrode, and a wiring pattern provided on the second insulating film and connected to the upper electrode.

In another embodiment, each memory cell may further include a first insulating film provided on the substrate including the gate electrode structure, the lower electrode provided on a portion of the first insulating film, the ferroelectric film provided on the lower electrode such that the ferroelectric film as has the same area as the lower electrode, the upper electrode provided on a portion of the ferroelectric film above the lower electrode, a second insulating film provided on the first insulating film including the ferroelectric capacitor, and a wiring pattern provided on the second insulating film and connected to the upper electrode.

In another embodiment, the ferroelectric capacitor may include the lower electrode provided directly on a portion of the gate electrode, the ferroelectric film provided on the lower electrode such that the ferroelectric film has the same area as the lower electrode, and the upper electrode provided on the ferroelectric film above the lower electrode such that the ferroelectric film has the same area as the lower electrode. Also, the memory cell may include an insulating film provided on the gate electrode including the ferroelectric capacitor, and a wiring pattern provided on the insulating film and connected to the upper electrode.

In another embodiment, the ferroelectric capacitor may include the lower electrode provided directly on a portion of the gate electrode, and the ferroelectric film provided on the lower electrode such that the ferroelectric film has the same area as the lower electrode. Also, the memory cell may include an insulating film provided on the gate electrode including the ferroelectric film, and a wiring pattern provided on the insulating film and connected to the ferroelectric film above the lower electrode such that the wiring pattern functions as the upper electrode.

In another embodiment, the each memory cell may further include a first insulating film provided on the substrate including the gate electrode structure, the lower electrode provided on a portion of the first insulating film connected to the gate electrode, the ferroelectric film provided on a portion of the lower electrode, the upper electrode provided on a portion of the ferroelectric film above the lower electrode, a second insulating film provided on the first insulating film including the ferroelectric capacitor, and a wiring pattern provided on the second insulating film and connected to the upper electrode.

In another embodiment, the memory cell may include the lower electrode provided on the gate electrode such that the lower electrode has the same area as the gate electrode, an insulating film provided on the substrate including the lower electrode to have a contact hole on the lower electrode, the ferroelectric film provided to fill the contact hole, and a wiring pattern provided on the ferroelectric film such that the wiring pattern functions as the upper electrode.

In another embodiment, each memory cell may further include a first insulating film provided on the substrate including the gate electrode structure, the lower electrode provided on a portion of the first insulating film and connected to the gate electrode, a second insulating film provided on the first insulating film including the lower electrode to have a contact hole on the lower electrode, the ferroelectric film provided to fill the contact hole, and the upper electrode provided on the ferroelectric film.

In another embodiment, each memory cell may further include an insulating film provided on the substrate including the gate electrode structure to have a contact hole on the gate electrode, the lower electrode provided to fill the contact hole, the ferroelectric film provided on the insulating film including the lower electrode, and the upper electrode provided on the ferroelectric film above the lower electrode.

In another embodiment, each memory cell may further include a first insulating film provided on the substrate including the gate electrode structure, the lower electrode provided on a portion of the first insulating film and connected to the gate electrode, a second insulating film provided on the first insulating film including the lower electrode to have a contact hole on the lower electrode, the ferroelectric film provided on the second insulating film, and the upper electrode provided on the ferroelectric film above the lower electrode.

In order to achieve another aspect of the present invention, a semiconductor memory device composed of a plurality of memory cells, each of which includes a field effect transistor formed on a semiconductor substrate, where said field effect transistor is composed of a gate electrode structure which is composed of a gate insulating film and a gate electrode provided thereon, and source and drain regions, and a ferroelectric capacitor composed of a lower electrode connected to said gate electrode, an upper electrode, and a capacitive ferroelectric film disposed between said upper and lower electrodes. In this case, a ratio of a thickness of said ferroelectric capacitive ferroelectric film to a thickness of said gate insulating film is in a range of 1 to 300, and a ratio of an area of said ferroelectric capacitor to an area of said gate electrode is in a range of 0.01 to 5.

In order to achieve still another aspect of the present invention, a semiconductor memory device composed of a plurality of memory cells, each of which is composed of a field effect transistor formed on a semiconductor substrate, where the field effect transistor is composed of a gate electrode structure which is composed of a gate insulating film and a gate electrode provided thereon, and source and drain regions, wherein an area of the gate electrode and a thickness of the gate insulating film are determined such that an electric field applied to the gate insulating film is smaller than a breakdown electric field of the gate insulating film, and a ferroelectric capacitor composed of a lower electrode connected to the gate electrode, an upper electrode, and a capacitive ferroelectric film disposed between the upper and lower electrodes, wherein an area of the ferroelectric capacitor is determined such that an electric field applied to the ferroelectric film is larger than a coercive electric field of the ferroelectric film.

BRIEF DESCRIPTION OF THE DRAWINGS

FIG. 8 is a cross sectional view illustrating the structure of a non-volatile semiconductor memory device using a ferroelectric film according to a first embodiment of the present invention;

DESCRIPTION OF THE PREFERRED EMBODIMENTS

The non-volatile semiconductor memory device using a ferroelectric film will be described below in detail with reference to the accompanying drawings.

Figure 1:
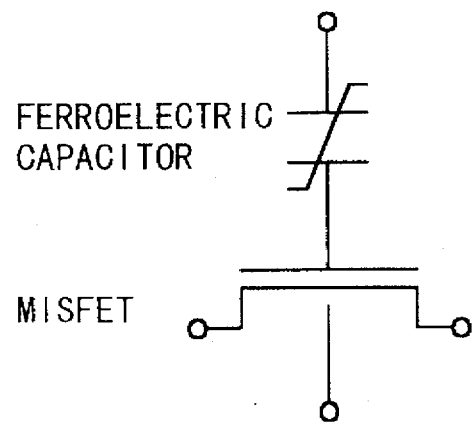
FIG. 1 is a diagram illustrating the circuit structure of a conventional non-volatile semiconductor memory device using a ferroelectric film.

In a case where a voltage is applied between one of the electrodes of the ferroelectric capacitor which is not connected to the gate of the MISFET and the semiconductor substrate in the circuit shown in FIG. 1, the applied voltage is equal to the summation of a voltage applied to the ferroelectric capacitor, a voltage applied to the gate insulating film of the MISFET and a voltage generated because of the bend of the band in the semiconductor substrate. Also, if there is charge of +Q on the electrode of the ferroelectric capacitor which is not connected to the gate electrode of the MISFET when a voltage is applied to the semiconductor memory device, there is charge of −Q on the other electrode of the ferroelectric capacitor which is connected to the gate electrode. For this reason, there is charge of +Q on the gate electrode of the MISFET. Therefore, charge of −Q is attracted on the surface of the semiconductor substrate under the gate electrode.

The relation of the voltage generated because of the bend of the band inside the semiconductor and the charge amount can be determined from a general relation in the semiconductor. Also, the relation of the voltage applied to the gate insulating film and the charge amount can be determined from a general relation when a voltage is applied to a normal dielectric capacitor. Since the relation of the voltage applied to the ferroelectric capacitor and the charge amount depends on the history of the electric field applied to the ferroelectric film until that time, any general relation representative of the relation is not provided at present time. However, the relation of the voltage applied to the ferroelectric capacitor and the charge amount can be measured by actually fabricating a ferroelectric capacitor and applying a voltage to the ferroelectric capacitor.

By determining conditions required to satisfy the voltage relation, the charge amount relation and the relation of the voltage and the charge amount in the course of change of the applied voltage and tracking the conditions until a maximum voltage is applied, the electric field of the gate insulating film and the electric field of the ferroelectric film can be determined upon the application of the maximum voltage. Because there are the case that a voltage is applied to the ferroelectric capacitor higher than the semiconductor substrate and the case that a higher voltage is applied to the semiconductor substrate, both the cases are to be considered. In this case, the maximum electric field is obtained on the side of larger electric field. The maximum electric field of the gate insulating film is required to be smaller than the breakdown electric field of the gate insulating film. For this reason, it is preferable that the area of the ferroelectric capacitor, the thickness of the ferroelectric film, the area of the gate electrode or an active region of the gate electrode, and the thickness of the gate insulating film satisfy the above conditions.

The inventor fabricated many ferroelectric capacitors and measured the electric field of each ferroelectric capacitor.

Figure 21:
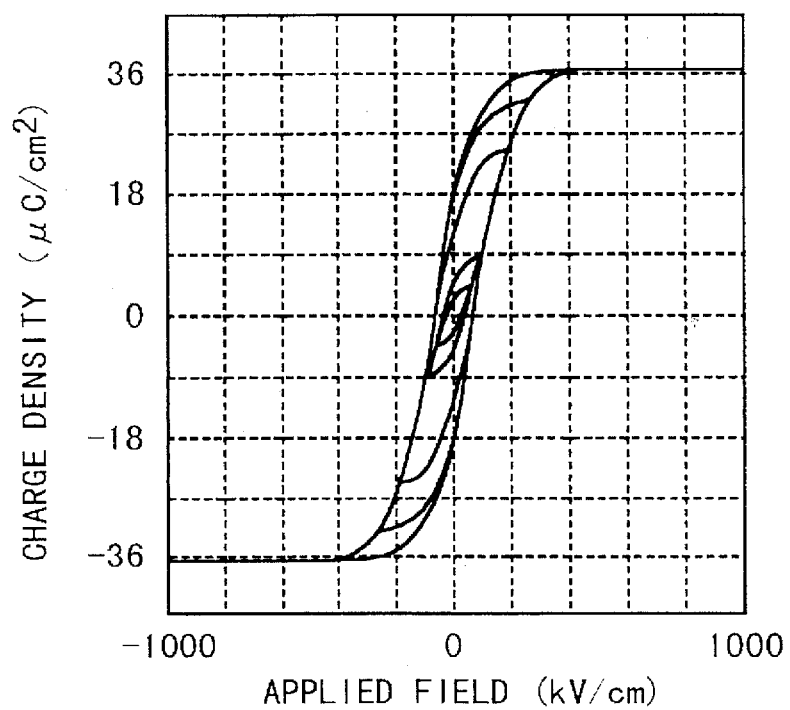
FIG. 21 is a graph illustrating hysteresis characteristics of a ferroelectric film used in the first to thirteenth embodiments.

In a case where a material having the characteristic of applied electric field and charge density shown in FIG. 21 is used as the material of the ferroelectric film and a material having the dielectric constant of 3.9 is used as a material of the gate insulating film, if the gate insulating film has the breakdown electric field of 5 MV/cm, the result was obtained that the breakdown of the gate insulating film does not occur under the conditions that the thickness of the gate insulating film is 10 nm, the thickness of the ferroelectric film is 300 nm, the ratio of the area of the ferroelectric capacitor to the area of the active region of the gate electrode structure is 0.03, and the maximum voltage is 15 V.

Figure 7:
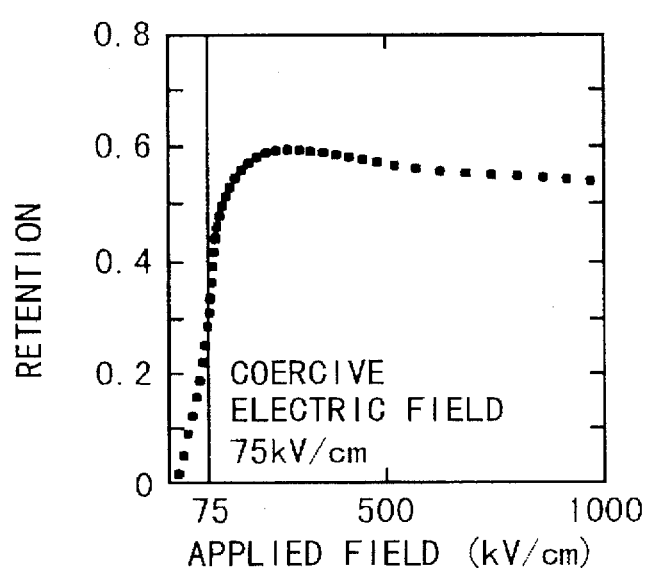
FIG. 7 is a graph illustrating dependency of retention upon applied electric field.
Figure 4:
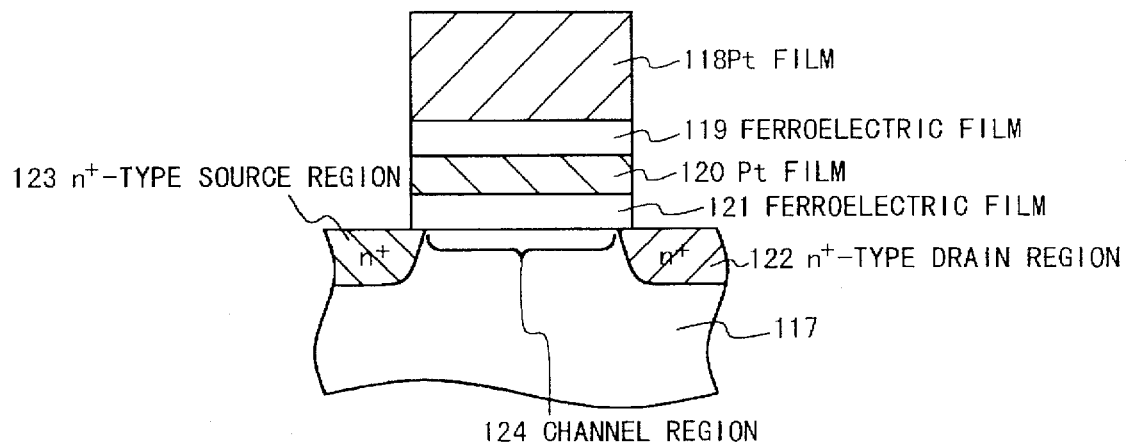
FIG. 4 is a cross sectional view illustrating the structure of a first conventional non-volatile semiconductor memory device using a ferroelectric film.
Figure 5:
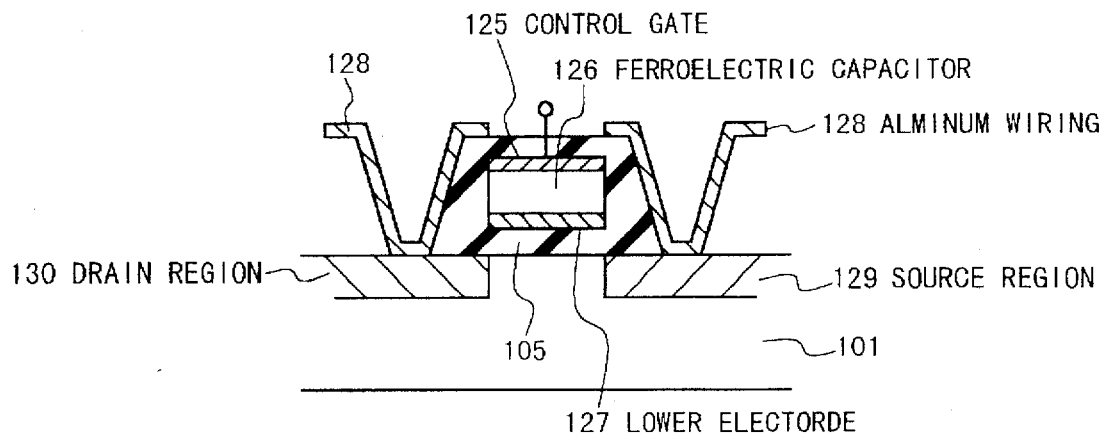
FIG. 5 is a cross sectional view illustrating the structure of a second conventional non-volatile semiconductor memory device using a ferroelectric film.
Figure 6:
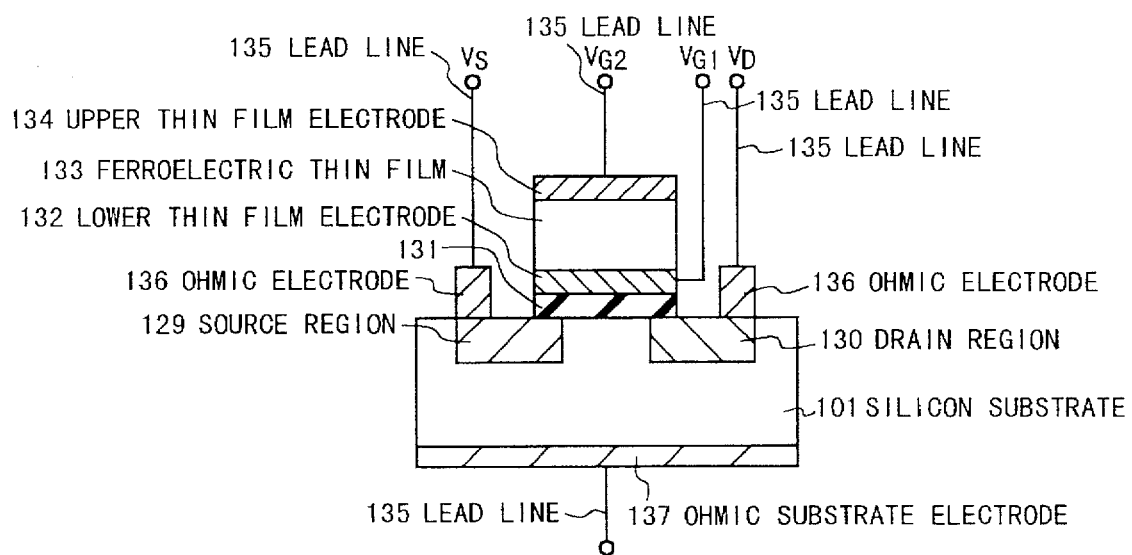
FIG. 6 is a cross sectional view illustrating the structure of a third conventional non-volatile semiconductor memory device using a ferroelectric film.

Also, the maximum electric field applied to the ferroelectric film at that time can be determined using the above-mentioned method. The retention of the ferroelectric film changes depending on the maximum electric field, as shown in FIG. 7, and the larger the maximum electric field is, the better the retention becomes. If the maximum electric field is larger than coercive electric field of the ferroelectric substance used for the ferroelectric capacitor, degradation of retention can be avoided.

In a case where a material having the electric field—charge density characteristic shown in FIG. 21 is used as the ferroelectric substance, the a material having the relative dielectric constant of 3.9 is used for the gate insulating film, there is obtained the result that the gate insulating film having the breakdown electric field of 5 MV/cm is not broken down and the electric field higher than the coercive electric field can be applied to the ferroelectric film under the conditions that the thickness of the gate insulating film is 10 nm, the thickness of the ferroelectric film is 100 nm, the ratio of the area of the ferroelectric capacitor to the area of the active region of the gate electrode structure is 0.03, and the maximum voltage is 15 V.

In the above description, if the electrode area of the ferroelectric capacitor is made small so that the capacitance of the ferroelectric capacitor is also made small, a larger voltage is applied to the ferroelectric capacitor compared to the case where the ferroelectric capacitor has the same area as the gate insulating film capacitor. In this case, since the thickness of the ferroelectric film of the ferroelectric capacitor is not changed, a larger electric field is applied to the ferroelectric film so that the polarization becomes stronger. Also, since the voltage applied to the gate insulating film is reduced, a sufficient margin is produced against the breakdown electric field of the gate insulating film. As a result, it becomes possible to further increase the voltage, so that the polarization of the ferroelectric film can be further made larger. This cannot be obtained when the ferroelectric capacitor is made smaller by making the ferroelectric film thicker.

On the other hand, if the area of the ferroelectric capacitor is made too smaller than that of the gate area, charges attracted due to the polarization are distributed under the wider gate. As a result, the charge density in the channel region is reduced. Therefore, there is an optimal value of the area ratio of the area of the ferroelectric capacitor to the gate area or active channel region area of the gate in order to increase the change density in the active channel region.

In addition, the thickness of the ferroelectric film, the area of the ferroelectric capacitor, the thickness of the gate insulating film and the area of the gate electrode or active channel region can be selected in such a manner that the maximum electric field applied to the ferroelectric film is larger than the coercive electric field of the ferroelectric film. In this case, the ferroelectric characteristic having good retention can be obtained.

If the ratio of the thickness of the ferroelectric film and the thickness of the gate insulating film is too small, there is a problem in that the fine process for the ferroelectric capacitor and the gate electrode structure having a large area are required so that it is difficult to realize the non-volatile semiconductor memory device using the ferroelectric film. On the contrary, if the ratio is too large, there is a problem in that the electric field applied to the ferroelectric film becomes small so that the gate charge density is reduced.

Further, if the ratio of the area of the ferroelectric capacitor to the area of the gate electrode or active region of the gate electrode is too large, there is a problem in that the gate charge density is reduced because the charges due to the polarization are distributed in the wide area. On the contrary, if the ratio is too small, there is a problem in that the electric field applied to the ferroelectric film becomes small so that the gate charge density is reduced.

From the above reasons, it is preferable that the ratio of the ferroelectric film to the gate insulating film in thickness is in a range of 1 to 300 and the ratio of the ferroelectric capacitor to the gate electrode or active region of the gate electrode is in a range of 0.01 to 5.

Next, a method of manufacturing a non-volatile semiconductor memory device with a ferroelectric capacitor of a small capacitance without changing the film thickness will be described below in detail.

Figure 2:
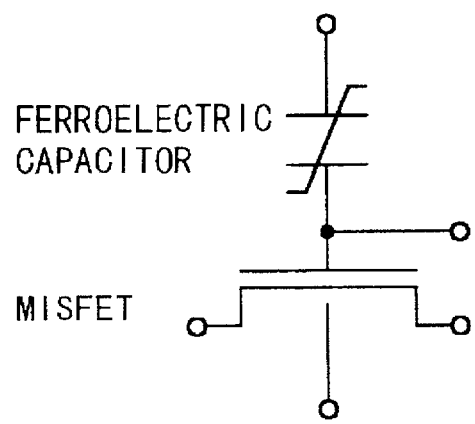
FIG. 2 is a diagram illustrating the circuit structure of another conventional non-volatile semiconductor memory device using a ferroelectric film.

FIG. 8 shows the cross sectional structure of the non-volatile semiconductor memory device using the ferroelectric capacitor according to the first embodiment of the present invention and FIG. 2 is a plan view of the non-volatile semiconductor memory device in the first embodiment.

Referring to FIG. 8, field oxide films 2 are formed on a silicon substrate 1 as element isolation regions. Then, after a transistor formation region is formed, a silicon oxide film 3 as a gate insulating film is formed by thermal oxidation. Subsequently, a polysilicon film 4 is deposited on the silicon oxide film 3 and then the polysilicon film 4 and the silicon oxide film 3 are patterned by using photolithography technique to form a gate electrode structure 21. Impurity ions such as phosphor ions and boron ions are implanted in the transistor formation region other than the gate electrode structure in a self-alignment manner using the gate electrode structure as a mask. As a result, the source and drain regions of a field effect transistor are formed, as shown in FIG. 22.

Next, a silicon oxide film 5-1 is deposited on the whole surface of the substrate 1 by a CVD method and then the surface of the silicon oxide film 5-1 is subjected to a chemical mechanical polishing (CMP) such that it is made flat. Next, a titanium (Ti) film 6 and a platinum film 7 are sequentially deposited on the whole surface of the substrate 1 by a sputtering method and then patterned by a milling method to form a lower electrode 22 having a desired size. As a result, a lower electrode 22 composed of the titanium film 6 and the platinum film 7 is completed. Subsequently, a PZT film 8 as a ferroelectric substance film 23 is spin-coated by a sol-gel method and sintered in an oxygen ambient. Then, the PZT film 8 is patterned to have a desired size, i.e., to be formed as a capacitive film 23 on a part of the lower electrode 22 by a milling method. Thereafter, a platinum film 9 is deposited by a sputtering method and milled to be patterned. As a result, an upper electrode 24 composed of the platinum film 9 is completed on a part of the PZT film 8. In this manner, a ferroelectric capacitor 25 is formed which is composed of the lower electrode 22, the capacitive film 23 and the upper electrode 24.

Figure 22:
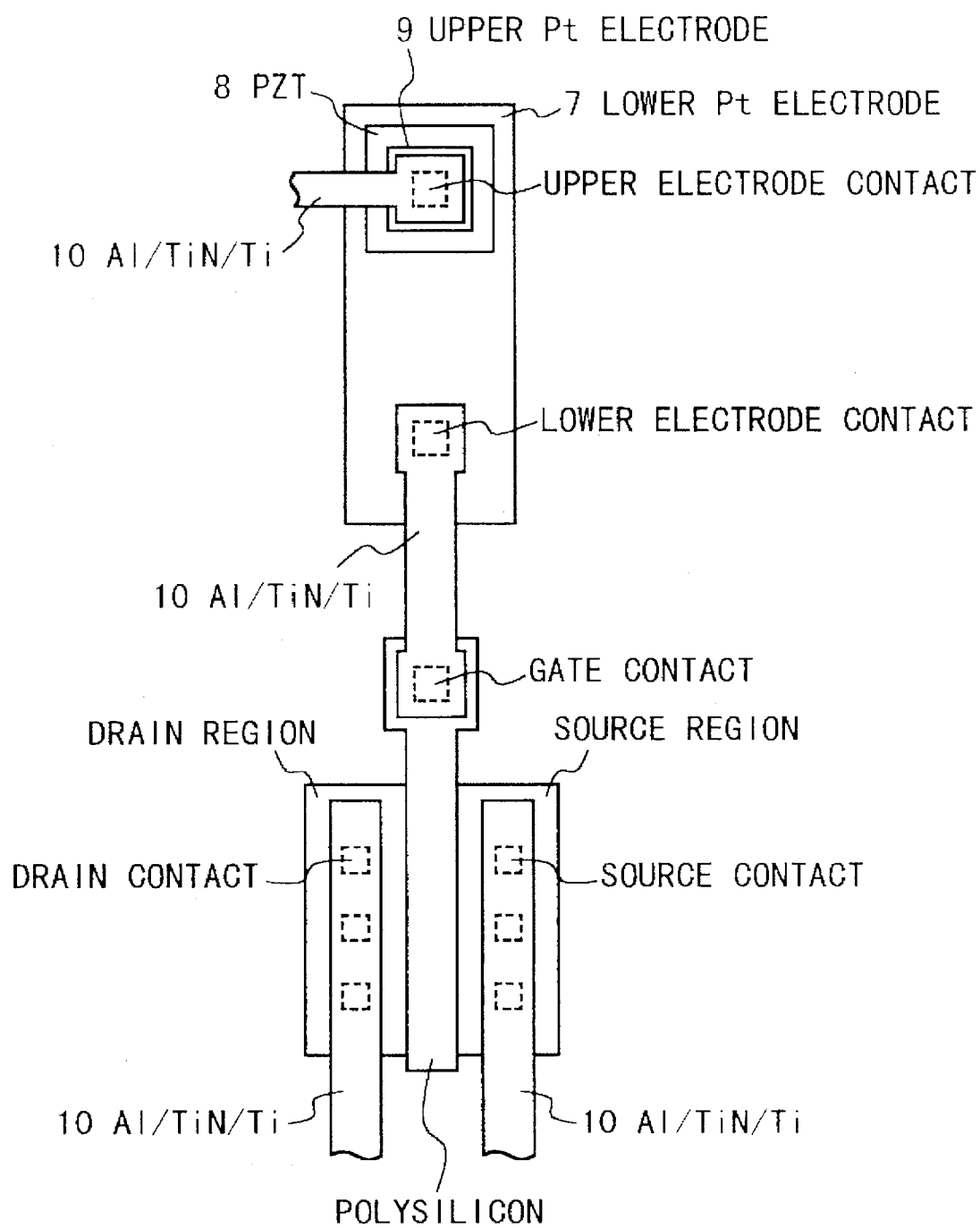
FIG. 22 is a plan view illustrating the non-volatile semiconductor memory device according to the first embodiment of the present invention.

Next, a silicon oxide film 5-2 is deposited on the whole surface of the substrate 1 and then a gate contact, a source contact, a drain contact and an upper electrode contact are opened as shown in FIG. 22. Subsequently, a laminate wiring film 10 composed of an aluminum film, a titanium nitride and a titanium film is deposited by a sputtering method and patterned. As a result, the gate electrode 4 of the MOSFET is connected to the lower electrode 22 of the ferroelectric capacitor 25. In this manner, the circuit shown in FIG. 1 is formed. Also, if the wiring film 10 which connects the gate electrode 4 and the lower electrode 22 of the ferroelectric capacitor 25 is connected to another element or a pad, the circuit shown in FIG. 2 can be formed.

In the above-mentioned structure, the area of the upper electrode 24 of the ferroelectric capacitor 25 is smaller than an area of a gate electrode structure 21 (region B in FIG. 8) or an area of a gate active region (region A in FIG. 8). AS the material of the gate insulating film 3, a normal dielectric substance such as CeO may be used in addition to silicon oxide.

Figure 9:
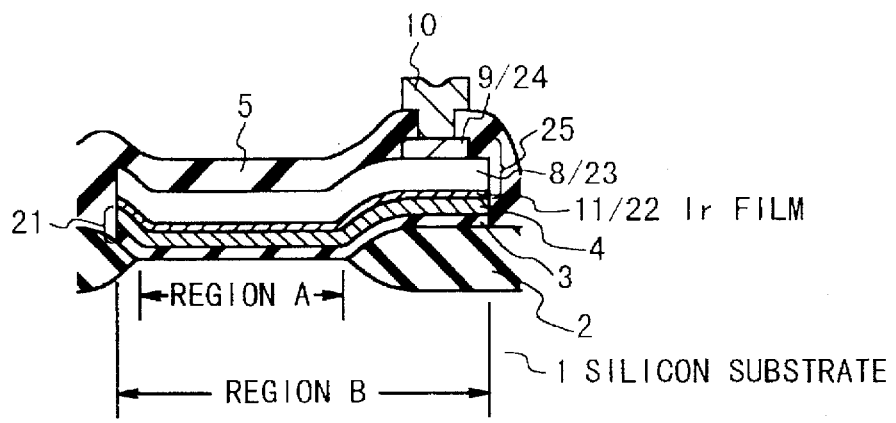
FIG. 9 is a cross sectional view illustrating the structure of a non-volatile semiconductor memory device according to a second embodiment of the present invention.

Next, the non-volatile semiconductor memory device according to the second embodiment of the present invention will be described. FIG. 9 shows the cross sectional structure of the non-volatile semiconductor memory device in the second embodiment of the present invention. Referring to FIG. 9, field oxide films 2 are formed on a silicon substrate 1 as element isolation regions. Then, after a transistor formation region is formed, a silicon oxide film 3 as a gate insulating film is formed by thermal oxidation. Subsequently, a polysilicon film 4 is deposited on the silicon oxide film 3. Thereafter, an iridium (Ir) film 11 is deposited on the polysilicon film 4. Subsequently, a PZT film 8 as a ferroelectric film is sputtered on the iridium film 11 and sintered at 650° C. in an oxygen ambient. Then, a platinum (Pt) film 9 is deposited on the PZT film 8 by a sputtering method.

Next, the platinum film 9 is milled using the photolithography technique such that an upper electrode 24 composed of the platinum film 9 is formed above a gate electrode structure 21 to be formed later. Subsequently, the PZT film 8, the iridium film 11, the polysilicon film 4, the silicon oxide film 3 are patterned using a milling method and a dry etching method. In this manner, a ferroelectric capacitor 25 is formed which is composed of the lower electrode 22 of the iridium film 11 and the polysilicon film 4, the capacitive film 23 of the PZT film 8 and the upper electrode 24 of the platinum film 9. Also, the gate electrode structure 21 is formed which is composed of the gate insulating film 3 and the gate polysilion electrode 4. In this case, the area of the upper electrode 24 is smaller than that of the lower electrode 22.

Next, impurity ions such as phosphor ions and boron ions are implanted in the transistor formation region other than the gate electrode structure 21 in a self-alignment manner using the gate electrode structure as a mask. As a result, source and drain regions of a MOSFET are formed.

In the second embodiment, because iridium oxide is conductive even if iridium is oxidized, the gate electrode is used in common to the lower electrode 22 of the ferroelectric capacitor 25. Thus, the circuit shown in FIG. 1 can be formed.

Figure 3:
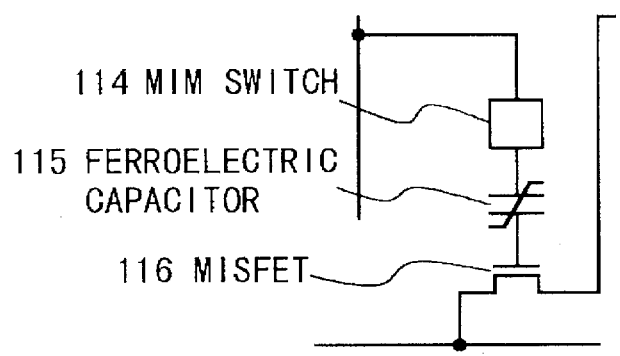
FIG. 3 is a diagram illustrating the circuit structure of still another conventional non-volatile semiconductor memory device using a ferroelectric film.

Further, after a silicon oxide film 5 is deposited on the whole surface of the substrate 1, the silicon oxide film 5 and the PZT film 8 may be etched back so that a contact hole is formed to exposure the iridium film 11. Then, if the laminate wiring film 10 is deposited in the contact hole and connected to another element or a pad, the circuit shown in FIG. 3 can be formed.

In the above-mentioned structure, the area of the ferroelectric capacitor 25 is determined substantially depending on the area of the upper electrode 24, and the area of the upper electrode 24 is smaller than an area of a gate electrode structure 21 (region B in FIG. 8) or an area of a gate active region (region A in FIG. 8).

Further, in the second embodiment, the lower electrode of the ferroelectric capacitor 25 is directly connected to the gate electrode 4. In the second embodiment, because the wiring film 10 is not used unlike the first embodiment, the non-volatile semiconductor device can be manufactured smaller than in the first embodiment.

Figure 10:
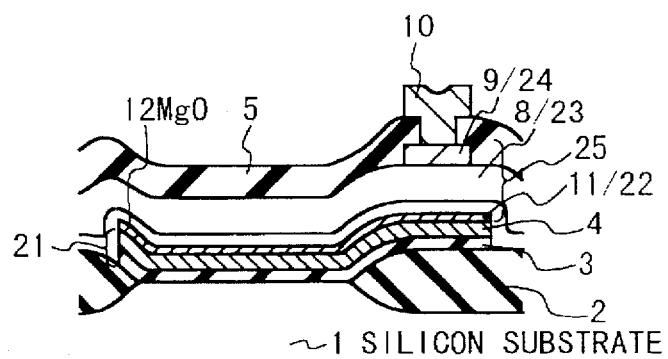
FIG. 10 is a cross sectional view illustrating the structure of a non-volatile semiconductor memory device according to a third embodiment of the present invention.

Next, the non-volatile semiconductor memory device using the ferroelectric capacitor according to the third embodiment of the present invention will be described below. FIG. 10 shows the cross sectional structure of the nonvolatile semiconductor memory device according to the third embodiment of the present invention. Referring to FIG. 10, field oxide films 2 are formed on a silicon substrate 1 as element isolation regions. Then, after a transistor formation region is formed, a silicon oxide film 3 as a gate insulating film is formed by thermal oxidation. Subsequently, a polysilicon film 4 is deposited on the silicon oxide film 3 and then the polysilicon film 4. After the polysilicon film 4 is deposited, an iridium film 11 is deposited by a sputtering method. Then, the iridium film 11, the polysilicon film 4 and the silicon oxide film 3 are patterned by using photolithography technique to form a gate electrode structure 21 and a lower electrode 22. Impurity ions such as phosphor ions and boron ions are implanted in the transistor formation region other than the gate electrode structure in a self-alignment manner using the gate electrode structure as a mask. As a result, source and drain regions of a MOSFET are formed.

Next, in order to prevent diffusion of ferroelectric substance into the silicon substrate 1 and to form a PZT film having good quality, a MgO film 12 is deposited on the whole surface of the substrate 1. Then, the PZT film 8 is deposited on the whole surface of the substrate 1 to form a capacitive film 23. The PZT film 8 is sintered in an oxygen ambient. Subsequently, a platinum film 9 is deposited by a sputtering method and is patterned such that the upper electrode 24 is formed on a small part of the PZT film 8 above the gate structure 21. In this manner, a ferroelectric capacitor 25 is formed which is composed of the lower electrode 22, the capacitive film 23 and the upper electrode 24.

Next, a silicon oxide film 5 is deposited on the whole surface of the substrate 1 and then an upper electrode contact is opened through the oxide film 5. Subsequently, a laminate wiring film 10 composed of an aluminum film, a titanium nitride and a titanium film is deposited by a sputtering method and patterned.

In the above-mentioned structure, because the ferroelectric film 8 needs not be patterned to match to the gate structure, unlike the second embodiment, the fabrication is easy compared to the case of the second embodiment. If the upper electrode 9 is used as a wiring pattern, and the gate electrode 4 and the upper electrode wiring pattern are formed in a cross manner, the ferroelectric capacitor 25 can be formed based on the minimum fabrication size of the gate electrode 4 and the minimum fabrication size of the upper electrode wiring pattern.

Figure 11:
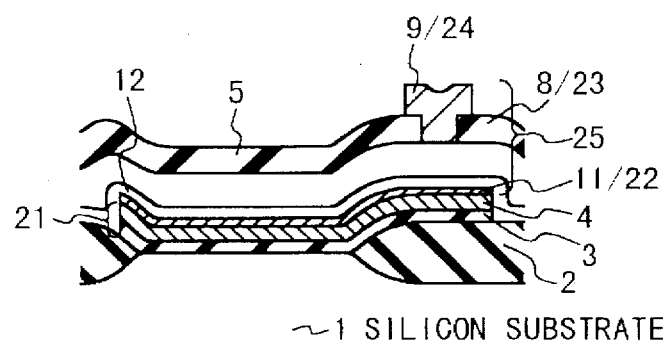
FIG. 11 is a cross sectional view illustrating the structure of a non-volatile semiconductor memory device according to a fourth embodiment of the present invention.

Next, the non-volatile semiconductor memory device using the ferroelectric capacitor according to the fourth embodiment of the present invention will be described below. FIG. 11 shows the cross sectional structure of the nonvolatile semiconductor memory device according to the fourth embodiment of the present invention. Referring to FIG. 11, in the fourth embodiment, the processes from the formation of the gate insulating film 3 to the formation of the PZT film 8 are the same as in the third embodiment.

Next, a silicon oxide film 5 is deposited on the whole surface of the substrate 1 and then an upper electrode contact is opened through the oxide film 5. Subsequently, a platinum wiring film 10 is deposited by a sputtering method and patterned.

In the above-mentioned structure, the ferroelectric capacitor 25 can be formed to have the upper electrode 24 equal in size to the upper electrode contact. Therefore, a smaller upper electrode can be formed because a contact formation margin is not necessary, compared to a case that a wiring pattern is connected to the upper electrode via the contact hole.

Figure 12:
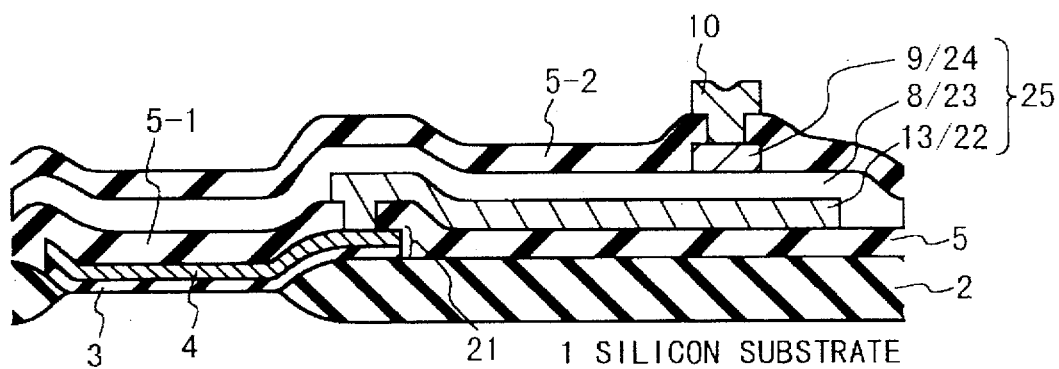
FIG. 12 is a cross sectional view illustrating the structure of a non-volatile semiconductor memory device according to a fifth embodiment of the present invention.

Next, the non-volatile semiconductor memory device using the ferroelectric capacitor according to the fifth embodiment of the present invention will be described below. FIG. 12 shows the cross sectional structure of the nonvolatile semiconductor memory device according to the fifth embodiment of the present invention. Referring to FIG. 12, field oxide films 2 are formed on a silicon substrate 1 as element isolation regions. Then, after a transistor formation region is formed, a silicon oxide film 3 as a gate insulating film is formed by thermal oxidation. Subsequently, a polysilicon film 4 is deposited on the silicon oxide film 3 and then the polysilicon film 4 and the silicon oxide film 3 are patterned by using photo-lithography technique to form a gate electrode structure 21. Impurity ions such as phosphor ions and boron ions are implanted in the transistor formation region other than the gate electrode structure in a self-alignment manner using the gate electrode structure as a mask. As a result, source and drain regions of a field effect transistor are formed.

Next, a silicon oxide film 5-1 as an interlayer insulating film is deposited on the whole surface of the substrate 1 by a CVD method an then a gate contact hole is formed through the silicon oxide film 5-1 to the gate electrode 4. Next, an iridium (Ir) film 13 is deposited on the whole surface of the substrate 1 by a sputtering method and then patterned to form a lower electrode 22 having a desired size. Subsequently, a PZT film 8 as a ferroelectric substance film is deposited by a sputtering method and sintered in an oxygen ambient. Then, a platinum film 9 is deposited by a sputtering method and milled to be patterned so as to form an upper electrode 24 above a part of the lower electrode 22. In this case, the area of the upper electrode 24 is very smaller than that of the lower electrode 22. In this manner, a ferroelectric capacitor 25 is formed which is composed of the lower electrode 22, the capacitive film 23 and the upper electrode 24.

Next, a silicon oxide film 5-2 is deposited on the whole substrate and then an upper electrode contact is opened through the silicon oxide film 5-2 to the upper electrode 24. Subsequently, a laminate wiring film 10 composed of an aluminum film, a titanium nitride and a titanium film is deposited by a sputtering method and patterned.

According to the fifth embodiment, because the interlayer insulating film is provided between the ferroelectric film 8 and the silicon substrate 1, the ferroelectric substance is difficult to diffuse to the substrate 1. Also, the depth of the gate contact hole is shallow, compared to the case shown in FIG. 8. If the upper electrode 24 is used as a wiring pattern, and the lower electrode 22 and the upper electrode 24 are formed in a cross manner, the ferroelectric capacitor 25 can be formed with a minimum fabrication size of the lower electrode and a minimum fabrication size of the upper electrode.

Figure 13:
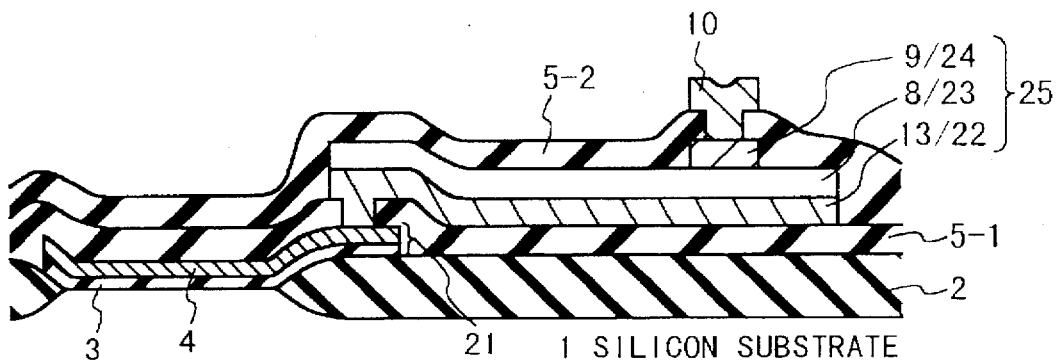
FIG. 13 is a cross sectional view illustrating the structure of a non-volatile semiconductor memory device according to a sixth embodiment of the present invention.

Next, the non-volatile semiconductor memory device using the ferroelectric capacitor according to the sixth embodiment of the present invention will be described below. FIG. 13 shows the cross sectional structure of the nonvolatile semiconductor memory device according to the sixth embodiment of the present invention. Referring to FIG. 13, the non-volatile semiconductor memory device according to the sixth semiconductor memory device is fabricated in the same manner as in the fifth embodiment mentioned above. The sixth embodiment is different from the fifth embodiment in that a platinum film 13 is deposited in place of the iridium film and after the PZT film 9 is deposited, the PZT film and the platinum film are patterned by a milling method.

According to the sixth embodiment, because the ferroelectric film 23 such as the PZT film 8 is sintered in a state in which the platinum wiring film is provided under the PZT film, diffusion of the ferroelectric substance into the silicon substrate 1 is very less, compared to the case shown in FIG. 12. It is desired that the diffusion amount is less because the transistor characteristics have a distribution and stability is degraded if the ferroelectric substance is diffused into the silicon substrate 1.

Further, if a platinum film is formed after an upper electrode contact hole is formed through the insulating film on the PZT film as shown in FIG. 11, the ferroelectric capacitor can be formed to have the size of the contact hole.

Figure 14:
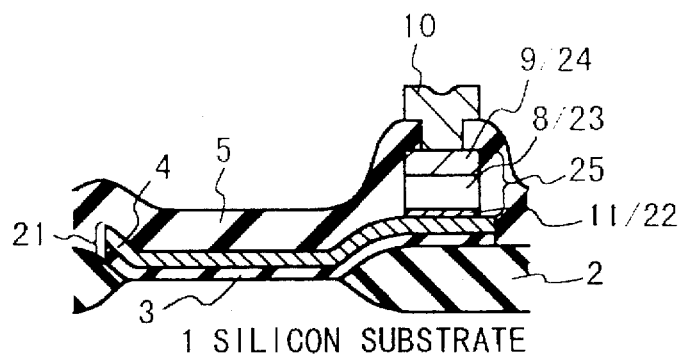
FIG. 14 is a cross sectional view illustrating the structure of a non-volatile semiconductor memory device according to a seventh embodiment of the present invention.

Next, the non-volatile semiconductor memory device using the ferroelectric capacitor according to the seventh embodiment of the present invention. FIG. 14 shows the cross sectional structure of the non-volatile semiconductor memory device according to the seventh embodiment of the present invention. Referring to FIG. 14, after the gate electrode structure 21 and the source/drain regions are formed in the same manner as in the first embodiment, an iridium (Ir) film 11 is deposited on the whole surface of the substrate 1 by a sputtering method. Subsequently, a PZT film 8 as a ferroelectric substance film and a platinum (Pt) film 9 are deposited by a sputtering method. The iridium film 11, the PZT film 8 and the platinum film 9 are patterned using a milling method and a dry etching method. As a result, a ferroelectric capacitor 25 is formed which is composed of the lower electrode 22 of the iridium film, the capacitive film 23 of the PZT film and the upper electrode 24 of the platinum film.

Next, a silicon oxide film 5 is deposited on the whole surface of the substrate 1 and then an upper electrode contact is opened. Subsequently, a laminate wiring film 10 composed of an aluminum film, a titanium nitride and a titanium film is deposited by a sputtering method and patterned.

According to the seventh embodiment, because the gate electrode structure 21 is formed in a step different from the fabrication of the ferroelectric capacitor, the fabrication is easier compared to the case that the fabrication of the ferroelectric capacitor and the fabrication of the gate electrode structure are performed at a time.

Also, a modification of the manufacturing method of the non-volatile semiconductor memory device may be used in which the polysilicon film 4 and the iridium film 11 are deposited and patterned to form the gate electrode structure 21 and then the PZT film 8 and the platinum film 9 are deposited and a portion other than the ferroelectric capacitor is removed by a milling method and a dry etching method. In still another method, a sol-gel solution of PZT is coated to form a PZT film, and after dried, the PZT film on the active region of the gate region is removed by a milling method and then a sintering method is performed for forming an upper electrode. In this case, diffusion of PZT into the silicon substrate 1 is less than that of PZT when the PZT in the solution is sintered. After the gate structure is formed, a MgO film may be deposited on the whole surface and then the PZT film may be deposited. In this case, the amount of PZT diffused into the silicon substrate 1 is reduced compared to the case that the PZT film is formed directly on the substrate 1.

If the upper electrode is formed as a wiring pattern and the PZT film is patterned using the upper electrode pattern, the ferroelectric capacitor is formed at a portion where the upper electrode pattern and the gate structure overlap. Thus, the upper electrode can be used as a wiring pattern.

Figure 15:
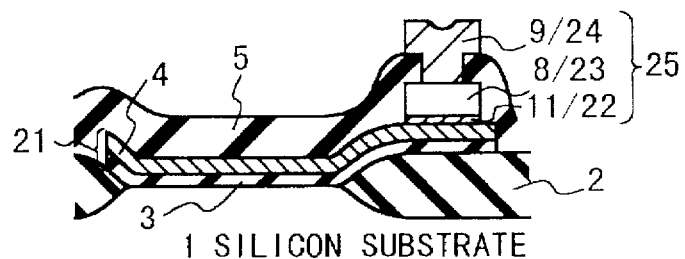
FIG. 15 is a cross sectional view illustrating the structure of a non-volatile semiconductor memory device according to an eighth embodiment of the present invention.

Next, the non-volatile semiconductor memory device using the ferroelectric capacitor according to the eighth embodiment of the present invention. FIG. 15 shows the cross sectional structure of the non-volatile semiconductor memory device according to the eighth embodiment of the present invention. Referring to FIG. 15, after the gate electrode structure 21 and the source/drain regions are formed in the same manner as in the first embodiment, an iridium (Ir) film 11 and the PZT film are deposited in that order on the whole surface of the substrate 1 by a sputtering method, like the seventh embodiment. Subsequently, the iridium film and the PZT film are patterned using a milling method and a dry etching method.

Next, a silicon oxide film 5 is deposited on the whole substrate and then a contact is opened. Subsequently, a platinum film 9 is deposited by a sputtering method to fill the upper electrode contact and patterned. As a result, a ferroelectric capacitor 25 which is composed of the lower electrode 22 of the iridium film, the capacitive film 23 of the PZT film and the upper electrode 24 of the platinum film is formed to have a contact hole size.

In the above-mentioned structure, the ferroelectric capacitor 25 can be formed to have the upper electrode 24 equal in size to the upper electrode contact. Therefore, a smaller upper electrode can be formed because a contact formation margin is not necessary, compared to a case that a wiring pattern is connected to the upper electrode via the contact hole.

Figure 16:
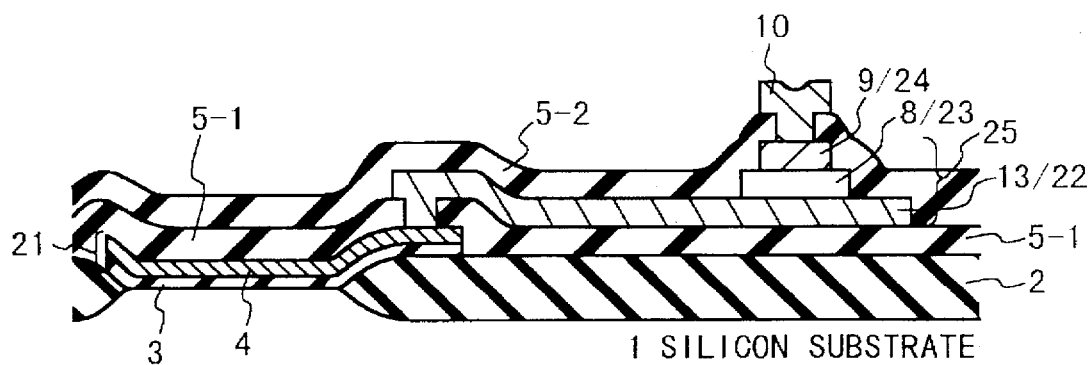
FIG. 16 is a cross sectional view illustrating the structure of a non-volatile semiconductor memory device according to a ninth embodiment of the present invention.

Next, the non-volatile semiconductor memory device using the ferroelectric capacitor according to the ninth embodiment of the present invention will be described below. FIG. 16 shows the cross sectional structure of the nonvolatile semiconductor memory device according to the ninth embodiment of the present invention. Referring to FIG. 16, the non-volatile semiconductor memory device according to the ninth semiconductor memory device is fabricated in the same manner as in the sixth embodiment mentioned above. The ninth embodiment is different from the sixth embodiment in that the iridium film is deposited in place of the platinum film and patterned, and after the PZT film 9 is deposited, the PZT film is patterned by a milling method.

According to the ninth embodiment, because the interlayer insulating film 5-1 is provided between the ferroelectric film such as the PZT film and the silicon substrate 1, diffusion of the ferroelectric substance into the silicon substrate 1 is very less. Also, the depth of the contact hole is shallow, compared to the case shown in FIG. 8. Compared to the fifth and sixth embodiment shown in FIGS. 7 and 8, the step height is made small at the portion where the ferroelectric film is removed so that the subsequent processes can be performed easily. Further, if the upper electrode 24 is formed as a wiring pattern and the PZT film 23 is patterned using the upper electrode pattern, the ferroelectric capacitor 25 is formed at a portion where the upper electrode pattern 24 and the gate electrode structure 21 overlap. Thus, the upper electrode 24 can be used as a wiring pattern.

Figure 17:
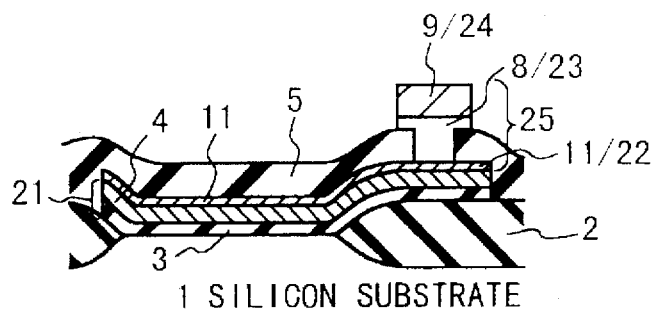
FIG. 17 is a cross sectional view illustrating the structure of a non-volatile semiconductor memory device according to a tenth embodiment of the present invention.

Next, the non-volatile semiconductor memory device using the ferroelectric capacitor according to the tenth embodiment of the present invention will be described below. FIG. 17 shows the cross sectional structure of the nonvolatile semiconductor memory device according to the tenth embodiment of the present invention. Referring to FIG. 17, the processes from the formation of the field oxide films 2 to the formation of the source/drain regions of the transistor are the same as in the third embodiment.

Next, a silicon oxide film 5 is deposited on the whole surface of the substrate 1 and then a contact hole is formed through the oxide film 5 to the iridium film. Subsequently, the PZT film 8 is formed on the whole surface of the substrate 1 by a sol-gel method to form a capacitive film 23. In order to form the PZT film of good quality, a buffer film of MgO may be formed before the PZT film is formed. After the PZT film 8 is sintered in an oxygen ambient, a platinum film 9 is deposited by a sputtering method. Then, the PZT film and the platinum film are patterned using a milling method to have a wiring pattern. Thus, the contact hole section is the ferroelectric capacitor. In a case that the platinum film is used as the wiring pattern, if it is required that the platinum film is thick, the platinum film of 200 nm is first deposited. Then, after the platinum film is patterned using the milling method, an aluminum film may be sputtered and patterned by a plasma etching. This method is easier than a method in which a thick platinum film is patterned.

According to the tenth embodiment, the ferroelectric capacitor can be formed with a size of the contact hole. Also, the step can be reduced by the thickness of the contact hole.

Figure 18:
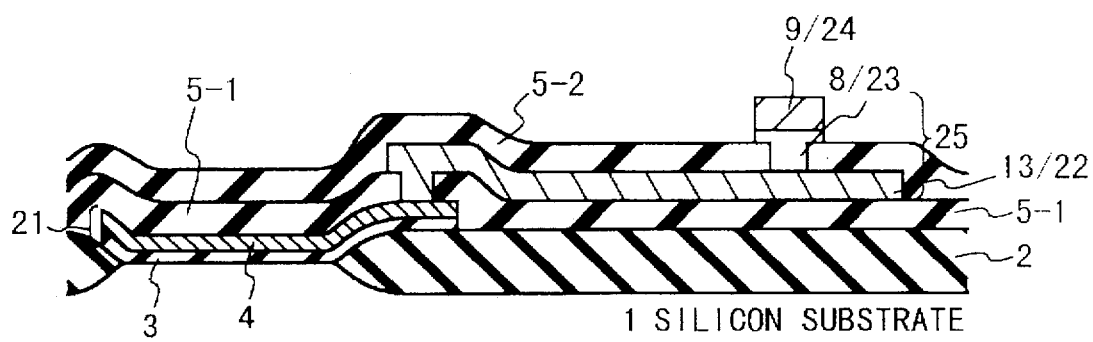
FIG. 18 is a cross sectional view illustrating the structure of a non-volatile semiconductor memory device according to an eleventh embodiment of the present invention.

Next, the non-volatile semiconductor memory device using the ferroelectric capacitor according to the eleventh embodiment of the present invention will be described below. FIG. 18 shows the cross sectional structure of the non-volatile semiconductor memory device according to the eleventh embodiment of the present invention. Referring to FIG. 18, the non-volatile semiconductor memory device according to the eleventh semiconductor memory device is fabricated in the same manner as in the sixth embodiment mentioned above. The eleventh embodiment is different from the sixth embodiment in that before the PZT film 8 is deposited, the silicon oxide film 5-2 is deposited. Also, the contact hole is formed through the silicon oxide film 5-2 to the iridium film 13 and the PZT film 8 is deposited to fill the contact hole. After the PZT film 9 is deposited, the PZT film 8 and the platinum film 9 are patterned by a milling method.

According to the eleventh embodiment, the ferroelectric capacitor can be formed with a size of the contact hole. Also, the step due to the ferroelectric film is reduced by the depth of the contact hole. Because the interlayer insulating film 5-1 as the interlayer insulating film is provided between the ferroelectric film 23 such as the PZT film 8 and the silicon substrate 1, diffusion of the ferroelectric substance into the silicon substrate 1 is very less.

Figure 19:
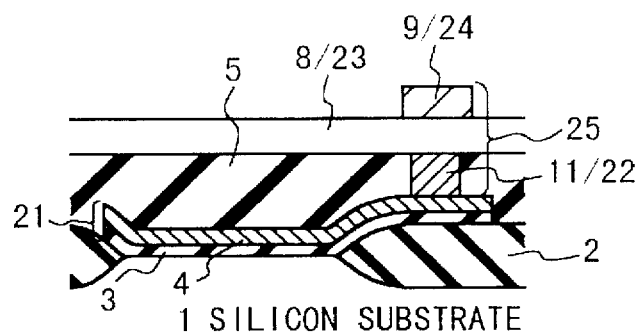
FIG. 19 is a cross sectional view illustrating the structure of a non-volatile semiconductor memory device according to a twelfth embodiment of the present invention.
Figure 20:
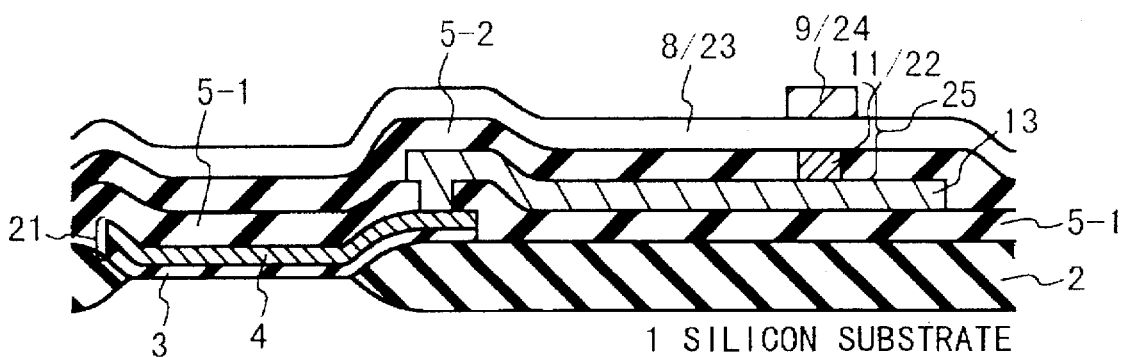
FIG. 20 is a cross sectional view illustrating the structure of a non-volatile semiconductor memory device according to a thirteenth embodiment of the present invention.

Next, the non-volatile semiconductor memory device using the ferroelectric capacitor according to the twelfth embodiment of the present invention will be described below. FIG. 19 shows the cross sectional structure of the nonvolatile semiconductor memory device according to the twelfth embodiment of the present invention. Referring to FIG. 19, the processes from the formation of the field oxide films 2 to the formation of the source/drain regions of the transistor are the sue as in the first embodiment.

Next, a silicon oxide film 5 is deposited on the whole surface of the substrate 1 and then a gate contact hole is formed through the oxide film 5 to the polysilicon film 4. Subsequently, an iridium film 11 is deposited to fill the gate contact hole so that a lower electrode 22 is formed. Then, the silicon oxide film 5 and the iridium film 11 are flattened by a chemical mechanical polishing (CMP) method. Thereafter, the PZT film 8 is formed on the whole surface of the substrate 1 by a sol-gel method or a sputtering method. In order to form the PZT film of good quality, a buffer film of MgO may be formed before the PZT film is formed. After the PZT film 8 as the capacitive film 23 is sintered in an oxygen ambient, a platinum film 9 is deposited by a sputtering method. Then, the platinum film is patterned using a milling method to form the upper electrode 24 above the lower electrode. Thus, the contact hole section is the ferroelectric capacitor 25. The ferroelectric film 8 other than the ferroelectric capacitor 25 may be removed using the upper electrode 24 as a mask.

In a case that the platinum film is used as the wiring pattern, if it is required that the platinum film is thick, the platinum film of 200 nm is first deposited. Then, after the platinum film is patterned using the milling method, an aluminum film may be sputtered and patterned by a plasma etching. This method is easier than a method in which a thick platinum film is patterned.

According to the tenth embodiment, the ferroelectric capacitor can be formed with a size of the contact hole. Also, the step can be reduced by the thickness of the contact hole.

Next, the non-volatile semiconductor memory device using the ferroelectric capacitor according to the thirteenth embodiment of the present invention will be described below. FIG. 18 shows the cross sectional structure of the nonvolatile semiconductor memory device according to the thirteenth embodiment of the present invention. Referring to FIG. 18, the non-volatile semiconductor memory device according to the thirteenth semiconductor memory device is fabricated in the same manner as in the sixth embodiment mentioned above. The eleventh embodiment is different from the sixth embodiment in the following processes. That is, before the PZT film 8 is deposited, the silicon oxide film 5-2 is deposited. Also, the contact hole is formed through the silicon oxide film 5-2 to the iridium film 13. Subsequently, an iridium film 11 is deposited by a sputtering method to fill the contact hole for forming a lower electrode 22. Then, the iridium film other than the contact hole is removed by a CMP method. Next, a PZT film 8 is deposited by a sol-gel method or a sputtering method. In order to form the PZT film 8 of good quality, a buffer film of MgO may be formed. After the PZT film 8 is deposited, a platinum film 9 is deposited and patterned to form the upper electrode 24 on the PZT film above the lower electrode 22.

According to the twelfth embodiment, the ferroelectric capacitor can be formed with a size of the contact hole. Also, because the interlayer insulating film 5-1 as the interlayer insulating film is provided between the ferroelectric film 23 such as the PZT film 8 and the silicon substrate 1, diffusion of the ferroelectric substance into the silicon substrate 1 is very less.

What is claimed is:

1. A semiconductor memory device composed of a plurality of memory cells, each of which comprises:
    a field effect transistor formed on a semiconductor substrate, wherein said field effect transistor is composed of a gate electrode structure which is composed of a gate insulating film and a gate electrode provided thereon, and source and drain regions; and
    a ferroelectric capacitor composed of a lower electrode connected to said gate electrode, an upper electrode, and a capacitive ferroelectric film disposed between said upper and lower electrodes, wherein an area of said ferroelectric capacitor is smaller than an area of one of said gate electrode and an active region of said gate electrode such that an electric field applied to said ferroelectric film is larger than a coercive electric field of said ferroelectric film and an electric field applied to said gate insulating film is smaller than a breakdown electric field of said gate insulating film.

2. A semiconductor memory device according to claim 1, wherein said each memory cell further includes:
    a first insulating film provided on said substrate including said gate electrode structure, wherein said ferroelectric capacitor is provided on said first insulating film, said ferroelectric film is provided on a portion of said lower electrode, and said upper electrode is provided on a portion of said ferroelectric film above said lower electrode;
    a second insulating film provided on said first insulating film including said ferroelectric capacitor;
    a first wiring pattern provided on said second insulating film to connect between said gate electrode and said lower electrode; and
    a second wiring pattern provided on said second insulating film and connected to said upper electrode.

3. A semiconductor memory device according to claim 1, wherein said ferroelectric capacitor includes:
    said lower electrode provided directly on said gate electrode with the same area as that of said gate electrode;
    said ferroelectric film provided directly on said lower electrode with the same area as that of said gate electrode; and
    said upper electrode provided directly on a portion of said ferroelectric film above said lower electrode.

4. A semiconductor memory device according to claim 1, wherein said ferroelectric capacitor includes:
    said lower electrode provided directly on said gate electrode with the same area as that of said gate electrode;
    an insulative preventing film for preventing diffusion of a ferroelectric material;
    said ferroelectric film provided on said preventing film, wherein said ferroelectric film is used in common to another memory cell; and
    said upper electrode provided directly on a portion of said ferroelectric film above said lower electrode, and
    wherein said memory cell includes:
        an insulating film provided on said ferroelectric capacitor; and
        a wiring pattern provided on said insulating film and connected to said upper electrode.

5. A semiconductor memory device according to claim 1, wherein said ferroelectric capacitor includes:
    said lower electrode provided directly on said gate electrode with the same area as that of said gate electrode;
    an insulative preventing film for preventing diffusion of a ferroelectric material; and
    said ferroelectric film provided on said preventing film, wherein said ferroelectric film is used in common to another memory cell, and
    wherein said memory cell includes:
        an insulating film provided on said ferroelectric capacitor; and
        a wiring pattern provided on said insulating film and connected to said ferroelectric film above said lower electrode such that said wiring pattern is used as said upper electrode.

6. A semiconductor memory device according to claim 1, wherein said each memory cell further includes:
    a first insulating film provided on said substrate including said gate electrode structure;
    said lower electrode provided on a portion of said first insulating film;
    said ferroelectric film provided on said first insulating film including said lower electrode such that said ferroelectric film is used in common by another memory cell;
    said upper electrode provided on a portion of said ferroelectric film above said lower electrode;
    a second insulating film provided on said ferroelectric film including said upper electrode; and
    a wiring pattern provided on said second insulating film and connected to said upper electrode.

7. A semiconductor memory device according to claim 1, wherein said each memory cell further includes:
    a first insulating film provided on said substrate including said gate electrode structure;
    said lower electrode provided on a portion of said first insulating film;
    said ferroelectric film provided on said lower electrode such that said ferroelectric film as has the same area as said lower electrode;

said upper electrode provided on a portion of said ferroelectric film above said lower electrode;

a second insulating film provided on said first insulating film including said ferroelectric capacitor; and a wiring pattern provided on said second insulating film and connected to said upper electrode.

8. A semiconductor memory device according to claim 1, wherein said ferroelectric capacitor includes:

said lower electrode provided directly on a portion of said gate electrode;

said ferroelectric film provided on said lower electrode such that said ferroelectric film has the same area as said lower electrode; and said upper electrode provided on said ferroelectric film above said lower electrode such that said ferroelectric film has the same area as said lower electrode, and wherein said memory cell includes:

an insulating film provided on said gate electrode including said ferroelectric capacitor; and a wiring pattern provided on said insulating film and connected to said upper electrode.

9. A semiconductor memory device according to claim 1, wherein said ferroelectric capacitor includes:

said lower electrode provided directly on a portion of said gate electrode; and said ferroelectric film provided on said lower electrode such that said ferroelectric film has the same area as said lower electrode, and wherein said memory cell includes:

an insulating film provided on said gate electrode including said ferroelectric film; and a wiring pattern provided on said insulating film and connected to said ferroelectric film above said lower electrode such that said wiring pattern functions as said upper electrode.

10. A semiconductor memory device according to claim 1, wherein said each memory cell further includes:

a first insulating film provided on said substrate including said gate electrode structure;

said lower electrode provided on a portion of said first insulating film connected to said gate electrode;

said ferroelectric film provided on a portion of said lower electrode;

said upper electrode provided on a portion of said ferroelectric film above said lower electrode;

a second insulating film provided on said first insulating film including said ferroelectric capacitor; and a wiring pattern provided on said second insulating film and connected to said upper electrode.

11. A semiconductor memory device according to claim 1, wherein said memory cell includes:

said lower electrode provided on said gate electrode such that said lower electrode has the same area as said gate electrode;

an insulating film provided on said substrate including said lower electrode to have a contact hole on said lower electrode;

said ferroelectric film provided to fill said contact hole; and a wiring pattern provided on said ferroelectric film such that said wiring pattern functions as said upper electrode.

12. A semiconductor memory device according to claim 1, wherein said each memory cell further includes:

a first insulating film provided on said substrate including said gate electrode structure;

said lower electrode provided on a portion of said first insulating film and connected to said gate electrode;

a second insulating film provided on said first insulating film including said lower electrode to have a contact hole on said lower electrode;

said ferroelectric film provided to fill said contact hole; and said upper electrode provided on said ferroelectric film.

13. A semiconductor memory device according to claim 1, wherein said each memory cell further includes:

an insulating film provided on said substrate including said gate electrode structure to have a contact hole on said gate electrode;

said lower electrode provided to fill said contact hole;

said ferroelectric film provided on said insulating film including said lower electrode; and said upper electrode provided on said ferroelectric film above said lower electrode.

14. A semiconductor memory device according to claim 1, wherein said each memory cell further includes:

a first insulating film provided on said substrate including said gate electrode structure;

said lower electrode provided on a portion of said first insulating film and connected to said gate electrode;

a second insulating film provided on said first insulating film including said lower electrode to have a contact hole on said lower electrode;

said ferroelectric film provided on said second insulating film; and said upper electrode provided on said ferroelectric film above said lower electrode.

15. A semiconductor memory device composed of a plurality of memory cells, each of which comprises:

a field effect transistor formed on a semiconductor substrate, where said field effect transistor is composed of a gate electrode structure which is composed of a gate insulating film and a gate electrode provided thereon, and source and drain regions; and a ferroelectric capacitor composed of a lower electrode connected to said gate electrode, an upper electrode, and a capacitive ferroelectric film disposed between said upper and lower electrodes, wherein a ratio of a thickness of said ferroelectric capacitive ferroelectric film to a thickness of said gate insulating film is in a range of 1 to 300, and a ratio of an area of said ferroelectric capacitor to an area of said gate electrode is in a range of 0.01 to 5.

16. A semiconductor memory device composed of a plurality of memory cells, each of which comprises:

a field effect transistor formed on a semiconductor substrate, where said field effect transistor is composed of a gate electrode structure which is composed of a gate insulating film and a gate electrode provided thereon, and source and drain regions, wherein an area of said gate electrode and a thickness of said gate insulating film are determined such that an electric field applied to said gate insulating film is smaller than a breakdown electric field of said gate insulating film; and a ferroelectric capacitor composed of a lower electrode connected to said gate electrode, an upper electrode, and a capacitive ferroelectric film disposed between said upper and lower electrodes, wherein an area of said ferroelectric capacitor is determined such that an electric field applied to said ferroelectric film is larger than a coercive electric field of said ferroelectric film.

* * * * *